(12) United States Patent
Kurita

(10) Patent No.: US 6,992,316 B2
(45) Date of Patent: Jan. 31, 2006

(54) ANGLED SENSORS FOR DETECTING SUBSTRATES

(75) Inventor: Shinichi Kurita, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 110 days.

(21) Appl. No.: 10/600,684

(22) Filed: Jun. 20, 2003

(65) Prior Publication Data

US 2004/0051060 A1    Mar. 18, 2004

Related U.S. Application Data

(60) Provisional application No. 60/390,607, filed on Jun. 21, 2002.

(51) Int. Cl.
*G01V 8/00* (2006.01)
*G01N 21/86* (2006.01)

(52) U.S. Cl. ............... 250/559.29; 250/559.4; 356/237.2; 356/600; 356/445; 414/935

(58) Field of Classification Search ........... 250/223 B, 250/223 R, 559.11, 559.29, 559.4; 356/445, 356/237.2, 600; 118/668, 676; 414/935
See application file for complete search history.

(56) References Cited

U.S. PATENT DOCUMENTS

| | | | |
|---|---|---|---|
| 5,095,204 A | 3/1992 | Novini | |
| 5,245,403 A | 9/1993 | Kato et al. | |
| 5,264,918 A | 11/1993 | Kagami | |
| 5,308,993 A | 5/1994 | Holman et al. | |
| 5,563,798 A * | 10/1996 | Berken et al. | 700/218 |
| 5,780,849 A | 7/1998 | Kikuchi | |
| 5,796,486 A | 8/1998 | Jacob | |
| 5,945,685 A | 8/1999 | Imaino et al. | |
| 5,980,194 A * | 11/1999 | Freerks et al. | 414/754 |
| 5,998,782 A | 12/1999 | Koyama et al. | |
| 6,111,638 A | 8/2000 | Chou et al. | |
| 6,222,991 B1 | 4/2001 | Davenport | |
| 6,251,692 B1 | 6/2001 | Hanson | |
| 6,352,466 B1 | 3/2002 | Moore | |

* cited by examiner

*Primary Examiner*—Stephone B. Allen
*Assistant Examiner*—Suezu Ellis
(74) *Attorney, Agent, or Firm*—Dugan & Dugan

(57) ABSTRACT

In a first aspect, an apparatus is provided for detecting substrates. The apparatus includes (1) a transmitter/receiver unit adapted to transmit a light beam through a substrate located within a transfer chamber; (2) a reflector adapted to receive the light beam transmitted from the transmitter/receiver unit and to reflect the transmitted light beam toward the transmitter/receiver unit; and (3) a controller coupled to the transmitter/receiver unit and adapted to determine whether a substrate is positioned between the transmitter/receiver unit and the reflector based on an intensity of the reflected light beam received by the transmitter/receiver unit. At least one of the transmitted and reflected light beams is adapted to strike a substrate positioned between the transmitter/receiver unit and the reflector with non-normal incidence. Numerous other aspects are provided.

14 Claims, 3 Drawing Sheets

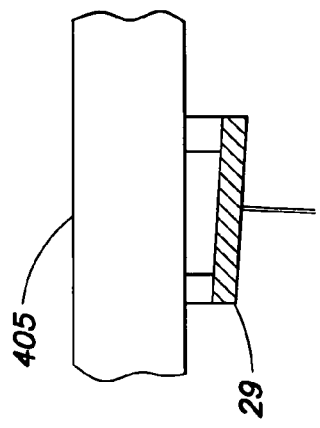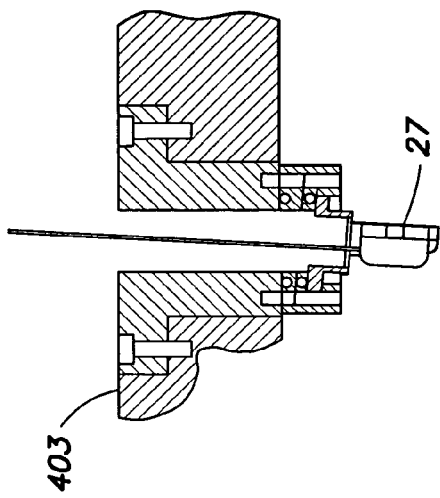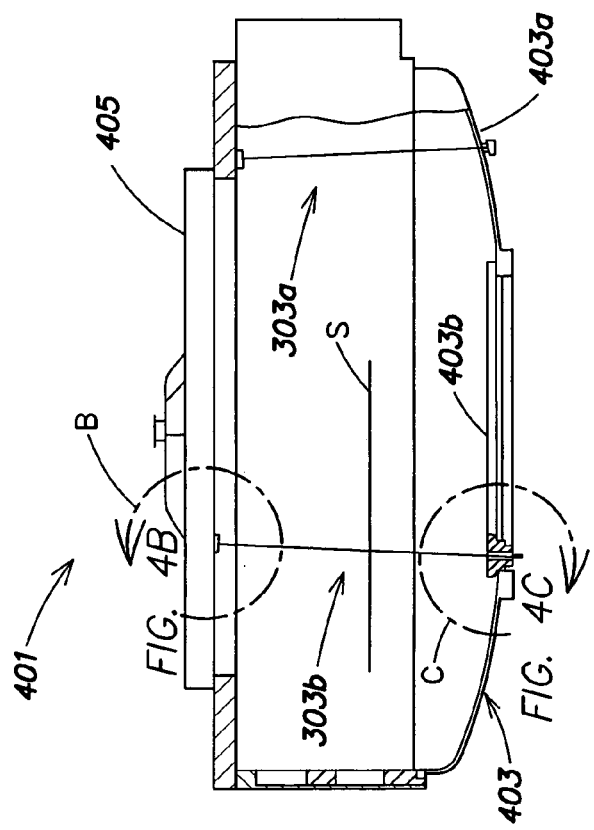

ANGLED SENSORS FOR DETECTING SUBSTRATES

The present application claims priority from U.S. Provisional Patent Application Ser. No. 60/390,607, filed Jun. 21, 2002, which is hereby incorporated by reference herein in its entirety.

FIELD OF THE INVENTION

This invention is concerned with substrate processing, and is more particularly concerned with detecting a substrate within a transfer chamber to which substrate processing chambers may be coupled.

BACKGROUND OF THE INVENTION

FIG. 1 is a somewhat schematic plan view of a conventional substrate processing tool 11 of the type which is used to apply semiconductor manufacturing processes to substrates such as silicon wafers or glass plates. As is familiar to those who are skilled in the art, silicon wafers may be used for fabrication of semiconductor devices such as processors, memory devices, etc. Glass plates may be processed to manufacture flat panel displays for use as computer monitors, television displays or the like.

The processing tool 11 includes a centrally located transfer chamber 13, to which process chambers 15 are coupled. In each of the chambers 15, a semiconductor fabrication process such as thin film deposition, oxidation or nitridization, etching, or thermal or lithographic processing, may be performed. Substrates to be processed in the processing tool 11 are introduced into the processing tool 11 via at least one load lock chamber 17 coupled to the transfer chamber 13. A substrate handling robot 19 is installed in the transfer chamber 13 to transfer substrates among the load lock chamber 17 and the process chambers 15.

It is known to equip a transfer chamber of a processing tool with sensors for detecting whether a substrate is present and is properly positioned for loading into one of the process, load lock, or other chambers coupled to the transfer chamber. One conventional sensor system for detecting the presence of a transparent substrate, such as a glass plate, is illustrated in FIG. 2.

FIG. 2 is a side schematic view of the transfer chamber 13 of FIG. 1. For convenience, only a top (lid) 21 and a bottom 23 of the transfer chamber 13 are shown. The transfer chamber 13 includes a sensor system 25 comprising a transmitter/receiver unit 27 and a reflector 29 coupled to the bottom 23 and top 21, respectively, of the transfer chamber 13. As is conventional, the transmitter/receiver unit 27 may be employed to transmit a light beam 31 toward a transparent substrate S (e.g., a glass substrate for a flat panel display). The transmitted beam 31 travels through the glass substrate, and reflects off of the reflector 29 so as to form a reflected beam 33. The reflected beam 33 travels back through the substrate S and is detected by the receiver portion (not separately shown) of the transmitter/receiver unit 27. Note that the spacing between the transmitted and reflected beams 31, 33 is exaggerated for clarification purposes (e.g., as the spacing between the transmitting and receiving portions of the transmitter/receiver unit 27 may be only about a quarter of an inch or less).

When the substrate S is not present between the transmitter/receiver unit 27 and the reflector 29, the reflected beam 33 which is detected by the transmitter/receiver unit 27 has approximately the same intensity as the transmitted beam 31. However, when the substrate S is present between the transmitter/receiver unit 27 and the reflector 29, the reflected beam 33 is attenuated by each pass through the substrate S (e.g., due to absorption, scattering, etc., by the substrate S); and the reflected beam 33 which is detected by the transmitter/receiver unit 27 has a smaller intensity than the transmitted beam 31. Accordingly, the presence/absence of the substrate S may be deduced based on the intensity of the reflected beam 33 (relative to the transmitted beam 31) detected by the transmitter/receiver unit 27.

Although such a conventional sensor arrangement should perform satisfactorily for its intended purpose, it has been found that such an sensor arrangement may occasionally produce false readings. Specifically, it has been found that the sensor system 25 may erroneously indicate that the substrate S is not present. Accordingly, an improved sensor system would be desirable.

SUMMARY OF THE INVENTION

According to a first aspect of the invention, an apparatus is provided for detecting substrates. The apparatus includes (1) a transmitter/receiver unit adapted to transmit a light beam through a substrate located within a transfer chamber; (2) a reflector adapted to receive the light beam transmitted from the transmitter/receiver unit and to reflect the transmitted light beam toward the transmitter/receiver unit; and (3) a controller coupled to the transmitter/receiver unit and adapted to determine whether a substrate is positioned between the transmitter/receiver unit and the reflector based on an intensity of the reflected light beam received by the transmitter/receiver unit. At least one of the transmitted and reflected light beams is adapted to strike a substrate positioned between the transmitter/receiver unit and the reflector with non-normal incidence.

In a second aspect of the invention, an apparatus for detecting substrates is provided that includes (1) a transfer chamber adapted to couple to at least one processing chamber and at least one load lock chamber; (2) a transmitter/receiver unit adapted to transmit a light beam through a substrate located within the transfer chamber; (2) a reflector adapted to receive the light beam transmitted from the transmitter/receiver unit and to reflect the transmitted light beam toward the transmitter/receiver unit; and (3) a controller coupled to the transmitter/receiver unit and adapted to determine whether a substrate is positioned between the transmitter/receiver unit and the reflector based on an intensity of the reflected light beam received by the transmitter/receiver unit. Both the transmitted and reflected light beams are adapted to strike a substrate positioned between the transmitter/receiver unit and the reflector with non-normal incidence. Numerous other aspects are provided, as are methods and systems in accordance with these and other aspects of the invention.

Other features and aspects of the present invention will become more fully apparent from the following detailed description of exemplary embodiments, the appended claims and the accompanying drawings.

BRIEF DESCRIPTION OF THE DRAWINGS

FIG. 4A is a schematic side view of an alternative embodiment of the present invention;

FIG. 4B is an enlarged view of an area B in FIG. 4A; and

FIG. 4C is an enlarged view of an area C in FIG. 4A.

DETAILED DESCRIPTION

Figure 2:
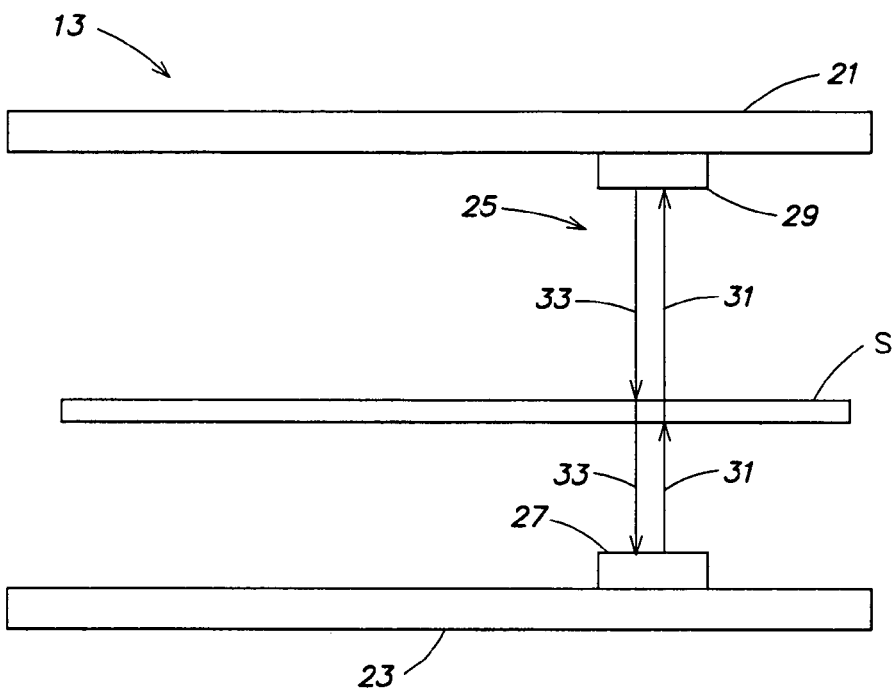
FIG. 2 is a side schematic view of the transfer chamber of FIG. 1.

In accordance with an aspect of the invention, substrate detecting sensors are arranged in a transfer chamber of a processing tool in a manner that reduces or eliminates false readings. Specifically, the transmitted and reflected beams of each transmitter/receiver unit and reflector pair are angled relative to a plane through which a substrate travels so as to avoid normal incidence of the transmitted and reflected beams on the substrate. In this manner, the false readings that may occur in conventional sensor systems, such as the sensor system 25 of FIG. 2, are reduced and/or eliminated.

Referring again to FIG. 2, the present inventor has found that the false readings that may be produced in the conventional sensor system 25 may be caused by multiple reflections and/or scattering events at the substrate S/transfer-chamber-environment interface (or at other interfaces) that produce additional light that is detected by the transmitter/receiver unit 27 when the substrate S is present. Such additional light may be falsely interpreted (e.g., by a controller (not shown) coupled to the sensor system 25) as indicating that the substrate S is not present. Such a false reading may occur even if the transmitted light beam 31 emitted by the transmitter/receiver unit 27 is polarized, the reflector 29 rotates the polarization of the transmitted beam 31 and the receiving portion (not shown) of the transmitter/receiver unit 27 is polarization sensitive.

Figure 3:
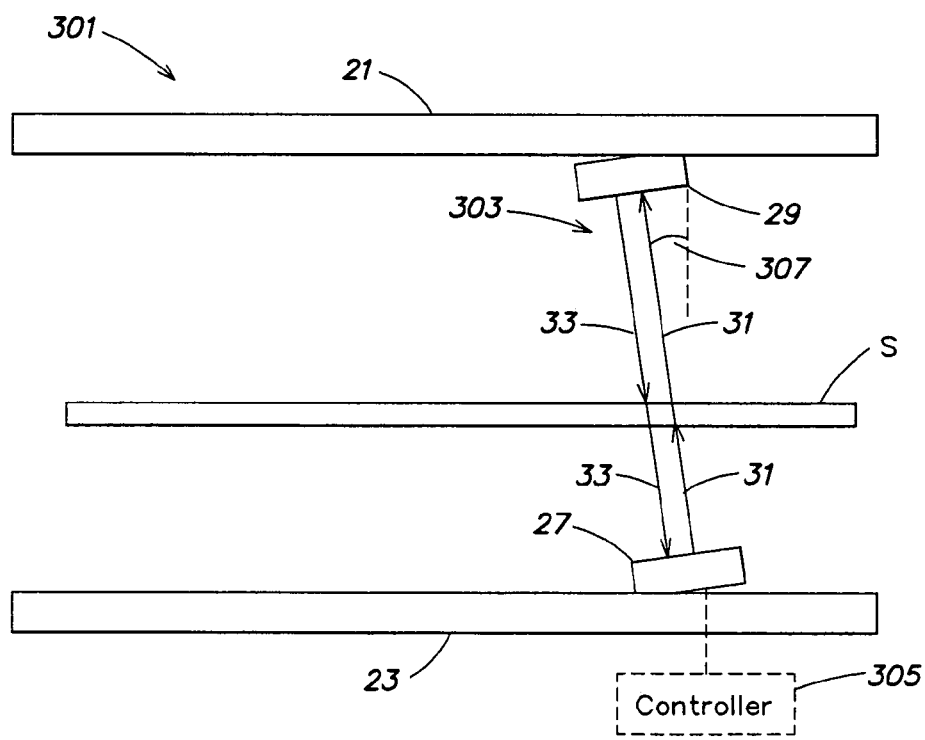
FIG. 3 is a side schematic view of a transfer chamber employing a sensor system provided in accordance with the present invention.

FIG. 3 is a side schematic view of a transfer chamber 301 employing a sensor system 303 provided in accordance with the present invention. The transfer chamber 301 may be similar to the transfer chamber 13 of FIGS. 1 and 2, but includes a controller 305 coupled to the sensor system 303 (for determining whether the substrate S is present or absent as described below).

With reference to FIG. 3, the sensor system 303 includes the transmitter/receiver unit 27 and the reflector 29. In at least one embodiment, the transmitter/receiver unit 27 of the sensor system 303 may be, for example, an Omron E32-R16 sensor head with an E3X-DA6 amplifier/transmitter/receiver (operating at 660 nanometers) and the reflector 29 of the sensor system 303 may be, for example, an Omron E39-R1 reflector (both manufactured by Omron, Inc.). Other amplifiers, transmitters, receivers, reflectors, operating wavelengths, etc., may be employed. A filter or similar mechanism may be employed to block thermal energy (e.g., infrared wavelengths) from reaching/heating the reflector 29 when a heated substrate is transferred within the transfer chamber 301, as such heating may affect the reflective properties of the reflector 29. For example, a filter that passes the wavelength or wavelengths emitted by the transmitter/receiver unit 27 but that reflects infrared wavelengths may be employed (e.g., positioned near the reflector 29).

Unlike in the conventional sensor system 25 of FIG. 2, in the novel sensor system 303 of FIG. 3, the transmitted beam 31 emitted by the transmitter/receiver unit 27 and the reflected beam 33 produced by the reflector 29 do not strike the substrate S at normal incidence (e.g., at a 90 degree angle relative to the plane of the substrate S as shown in FIG. 3). By eliminating such normal incidence, the reflections, scattering or other mechanisms that produce false readings in the conventional sensor system 25 of FIG. 2 are reduced and/or eliminated.

Non-normal incidence of the transmitted and reflected beams 31, 33 may be achieved in a number of ways. For example, both the transmitter/receiver unit 27 and the reflector 29 may be (similarly) angled relative to the transfer chamber lid 21 and bottom 23 (as shown in FIG. 3), and thus relative to the substrate S. Alternatively, a suitable optical device (not shown) such as a prism, mirror, etc., may be employed to change the direction of the transmitted and/or reflected beams 31, 33 and one or both of the transmitter/receiver unit 27 and the reflector 29 may be positioned substantially parallel to the major surface of the substrate S (as shown in FIG. 2). Any other technique for inducing an angle to the transmitted and/or reflected beams 31, 33 that eliminates non-normal incidence may be employed.

In at least one embodiment of the invention, the angle of the transmitted and reflected beams 31, 33 from normal incidence with the substrate S (reference numeral 307 in FIG. 3) is greater than about 1.9 degrees, preferably about 2 to 6 degrees and more preferably about 3.8 degrees. Stated another way, the transmitted and reflected beams 31, 33 may be about 84 to 88 degrees from the plane of the substrate S (preferably about 86 degrees). Other angles may be employed, although a small angle from normal incidence allows approximately the same position on the substrate S to be measured even if the substrate S travels through the transfer chamber 301 at different elevations/planes.

As stated, the controller 305 may be employed, among other things, to detect the absence/presence of the substrate S (e.g., based on the intensity of the reflected beam 33). When the substrate S is a glass substrate, the intensity loss for each pass through the substrate S is about 10%, making the intensity of the reflected beam 33 detected by the transmitter/receiver unit 27 about 20% less than the intensity of the transmitted beam 31 (assuming the substrate S is positioned between the transmitter/receiver unit 27 and the reflector 29).

FIG. 4A is a schematic side view of an alternative embodiment of the present invention. With reference to FIG. 4A, rather than employing the sensor system 303 of FIG. 3 in a conventional transfer chamber, the sensor system 303 is implemented in a transfer chamber 401 having a domed bottom 403 as described in U.S. Provisional Patent Application Ser. No. 60/390,629, filed Jun. 21, 2002 and titled "Transfer Chamber for Vacuum Processing System" and U.S. Provisional Patent Application Ser. No. 60/392,578, filed Jun. 28, 2002 and titled "Transfer Chamber for Vacuum Processing System", both of which are hereby incorporated by reference herein in their entirety. As described in the above referenced patent applications, the domed bottom 403 of the transfer chamber 401 provides improved strength with reduced thickness. In the embodiment of FIG. 4A, a first sensor system 303a is shown coupled to a domed portion 403a of the domed bottom 403 of the transfer chamber 401 and to a lid 405 of the transfer chamber 401. A second sensor system 303b is shown coupled to a non-domed portion 403b of the domed bottom 403 and to the lid 405 of the transfer chamber 401. FIG. 4B is an enlarged view of an area B in FIG. 4A showing that the reflector 29 is angled relative to the lid 405 (and thus relative to the substrate S); and FIG. 4C is an enlarged view of an area C in FIG. 4A showing that the transmitter/receiver unit 27 is angled relative to the domed bottom 403 (and thus relative to the substrate S).

The sensor system of the present invention also may be employed as part of the shared sensor system described in U.S. Provisional Patent Application Ser. No. 60/390,764, filed Jun. 21, 2002 and titled "Shared Sensors for Detecting Substrate Position/Presence" which is hereby incorporated by reference herein in its entirety.

The foregoing description discloses only exemplary embodiments of the invention; modifications of the above disclosed apparatus and methods which fall within the scope of the invention will be readily apparent to those of ordinary skill in the art. For example, the present invention is illustrated with regard to detection of glass plates, but it is also contemplated to apply the present invention to detection of other types of substrates. The transmitter/receiver unit may comprise a separate transmitter and a separate receiver (e.g., the transmitter and receiver need not be packaged together).

Also, in the particular embodiment illustrated herein, a transfer chamber adapted to have seven chambers coupled thereto is shown. The principles of the present invention may be applied to transfer chambers adapted to couple to more or fewer than seven chambers. Also, the principles of the present invention may be applied whether or not all of the chambers that a transfer chamber may accommodate are present and/or when multiple load lock chambers are employed. While the sensor arrangement of the present invention has been described for use within a transfer chamber, it will be understood that the inventive sensor arrangement may be employed with other chambers such as a process chamber or the like.

All or a portion of each transmitter/receiver unit and/or reflector may be located within or outside of a chamber in which the inventive sensor arrangement is employed (e.g., by transmitting light beams through one or more quartz windows in an external or partially external sensor arrangement).

Figure 1:
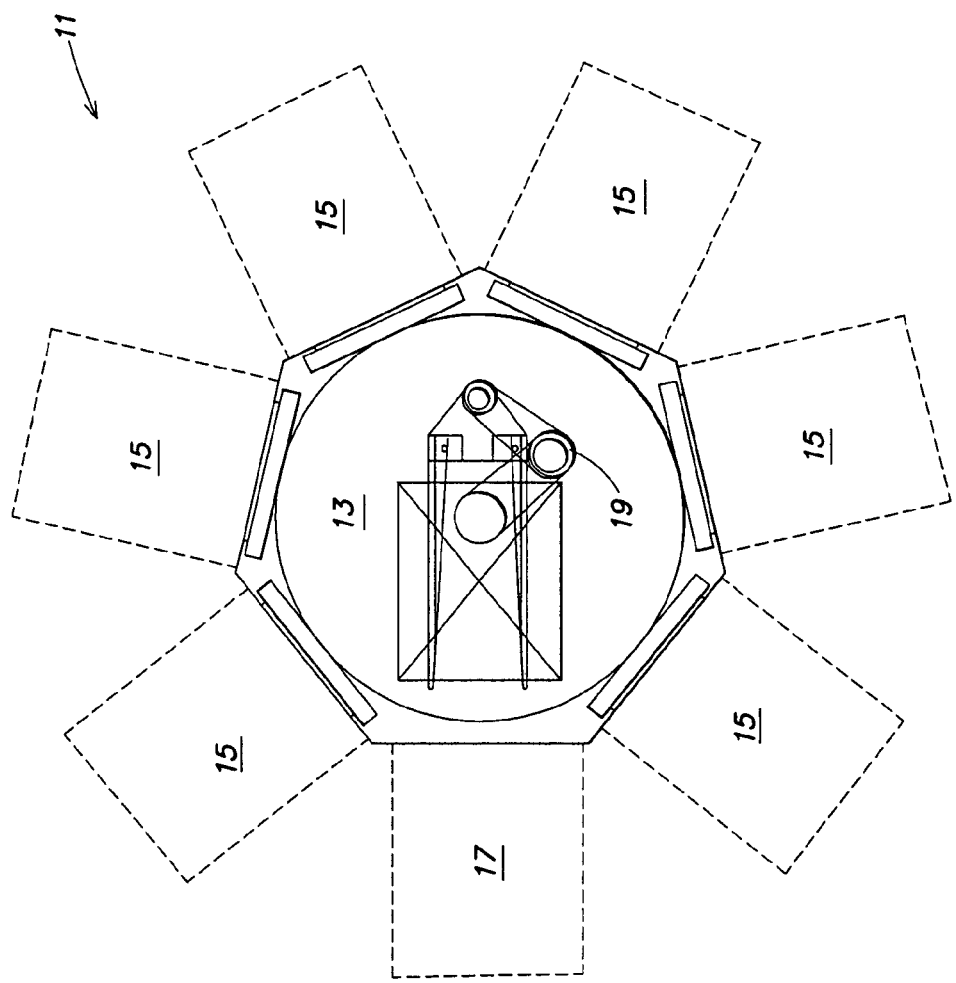
FIG. 1 is a schematic plan view of a conventional processing tool in which semiconductor fabrication processes are applied to substrates.

The substrate handling robot included in the inventive transfer chamber of FIG. 3 may be any type of substrate handler, and need not be the type illustrated in FIG. 1.

Accordingly, while the present invention has been disclosed in connection with exemplary embodiments thereof, it should be understood that other embodiments may fall within the spirit and scope of the invention, as defined by the following claims.

The invention claimed is:

1. An apparatus for detecting substrates, comprising:
    a transmitter/receiver unit adapted to transmit a light beam through a substrate located within a transfer chamber;
    a reflector adapted to receive the light beam transmitted from the transmitter/receiver unit and to reflect the transmitted light beam toward the transmitter/receiver unit; and
    a controller coupled to the transmitter/receiver unit and adapted to determine whether the substrate is positioned between the transmitter/receiver unit and the reflector based on an intensity of the reflected light beam received by the transmitter/receiver unit;
    wherein at least one of the transmitted and reflected light beams is adapted to strike the substrate positioned between the transmitter/receiver unit and the reflector with non-normal incidence.

2. The apparatus of claim 1 wherein the transmitter/receiver unit and the reflector are both angled relative to a path of the substrate that travels through the transfer chamber so that both the transmitted and reflected light beams strike the substrate with non-normal incidence.

3. The apparatus of claim 1 wherein the transmitted and reflected light beams are adapted to strike the substrate positioned between the transmitter/receiver unit and the reflector at an angle of between about 2 to 6 degrees from normal incidence.

4. The apparatus of claim 3 wherein the transmitted and reflected light beams are adapted to strike the substrate positioned between the transmitter/receiver unit and the reflector at an angle of about 3.8 degrees from normal incidence.

5. The apparatus of claim 1 wherein the transmitted and reflected light beams are approximately parallel.

6. The apparatus of claim 1 further comprising a plurality of transmitter/receiver unit and reflector pairs, each having transmitted and reflected light beams adapted to strike the substrate positioned between the transmitter/receiver unit and reflector pair with non-normal incidence.

7. An apparatus for detecting substrates, comprising:
    a transfer chamber adapted to couple to at least one processing chamber and at least one load lock chamber;
    a transmitter/receiver unit adapted to transmit a light beam through a substrate located within the transfer chamber;
    a reflector adapted to receive the light beam transmitted from the transmitter/receiver unit and to reflect the transmitted light beam toward the transmitter/receiver unit; and
    a controller coupled to the transmitter/receiver unit and adapted to determine whether the substrate is positioned between the transmitter/receiver unit and the reflector based on an intensity of the reflected light beam received by the transmitter/receiver unit;
    wherein both the transmitted and reflected light beams are adapted to strike the substrate positioned between the transmitter/receiver unit and the reflector with non-normal incidence.

8. The apparatus of claim 7 wherein the transmitter/receiver unit and the reflector are both angled relative to a path of the substrate that travels through the transfer chamber so that both the transmitted and reflected light beams strike the substrate with non-normal incidence.

9. A method of detecting a substrate within a chamber comprising:
    transmitting a light beam through the substrate;
    reflecting the light beam back through the substrate;
    detecting an intensity of the reflected light beam; and
    determining whether the substrate is located within the chamber based on the intensity of the reflected light beam;
    wherein at least one of the transmitted and reflected light beams strikes the substrate with non-normal incidence.

10. The method of claim 9 wherein the transmitted and reflected light beams are approximately parallel.

11. A method of detecting a substrate within a chamber comprising:
    transmitting a light beam through the substrate with non-normal incidence;
    reflecting the light beam back through the substrate with non-normal incidence;
    detecting an intensity of the reflected light beam; and
    determining whether the substrate is located within the chamber based on the intensity of the reflected light beam.

12. The method of claim 11 wherein the transmitted and reflected light beams strike the substrate at an angle of between about 2 to 6 degrees from normal incidence.

13. The method of claim 12 wherein the transmitted and reflected light beams strike the substrate at an angle of about 3.8 degrees from normal incidence.

14. The method of claim 11 wherein the transmitted and reflected light beams are approximately parallel.

* * * * *